US010570508B2

(12) United States Patent
Takagi et al.

(10) Patent No.: US 10,570,508 B2
(45) Date of Patent: Feb. 25, 2020

(54) FILM FORMING APPARATUS, FILM FORMING METHOD AND HEAT INSULATING MEMBER

(71) Applicant: TOKYO ELECTRON LIMITED, Tokyo (JP)

(72) Inventors: Satoshi Takagi, Nirasaki (JP); Katsuhiko Komori, Nirasaki (JP); Mitsuhiro Okada, Nirasaki (JP); Masahisa Watanabe, Nirasaki (JP); Kazuya Takahashi, Nirasaki (JP); Kazuki Yano, Nirasaki (JP); Keisuke Fujita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/852,668

(22) Filed: Dec. 22, 2017

(65) Prior Publication Data

US 2018/0179625 A1 Jun. 28, 2018

(30) Foreign Application Priority Data

Dec. 26, 2016 (JP) ................................ 2016-251378

(51) Int. Cl.
*C23C 16/24* (2006.01)
*C23C 16/455* (2006.01)
(Continued)

(52) U.S. Cl.
CPC ........ *C23C 16/24* (2013.01); *C23C 16/45544* (2013.01); *C23C 16/45546* (2013.01); *C23C 16/46* (2013.01); *H01L 21/205* (2013.01); *H01L 21/22* (2013.01); *H01L 21/28562* (2013.01); *H01L 21/32051* (2013.01); *H01L 21/67017* (2013.01); *H01L 21/67103* (2013.01);
(Continued)

(58) Field of Classification Search
None
See application file for complete search history.

(56) References Cited

U.S. PATENT DOCUMENTS 7,993,705 B2 * 8/2011 Nodera ............... C23C 16/4404 118/70
2015/0201468 A1 * 7/2015 Yonenaga .............. H05B 6/105 219/634

FOREIGN PATENT DOCUMENTS

JP H07-122504 A 5/1995

* cited by examiner

*Primary Examiner* — Jethro M. Pence
(74) *Attorney, Agent, or Firm* — Nath, Goldberg & Meyer; Jerald L. Meyer

(57) ABSTRACT

There is provided a film forming apparatus for performing a film forming process on substrates by heating the substrates while the substrates are held in a shelf shape by a substrate holder in a vertical reaction container. The film forming apparatus includes: an exhaust part configured to evacuate the reaction container; a gas supply part configured to supply a film forming gas into the reaction container; a heat insulating member provided above or below an arrangement region of the substrates to overlap with the arrangement region and configured to thermally insulate the arrangement region from an upper region above the arrangement region or a lower region below the arrangement region; and a through-hole provided in the heat insulating member at a position overlapping with central portions of the substrates to adjust a temperature distribution in a plane of each substrate held near the heat insulating member.

4 Claims, 17 Drawing Sheets

(51) Int. Cl.

| | |
|---|---|
| ***H01L 21/205*** | (2006.01) |
| ***H01L 21/22*** | (2006.01) |
| ***H01L 21/285*** | (2006.01) |
| ***H01L 21/3205*** | (2006.01) |
| ***H01L 21/67*** | (2006.01) |
| ***H01L 21/673*** | (2006.01) |
| ***C23C 16/46*** | (2006.01) |

(52) U.S. Cl.

CPC .. *H01L 21/67109* (2013.01); *H01L 21/67248* (2013.01); *H01L 21/67303* (2013.01)

FILM FORMING APPARATUS, FILM FORMING METHOD AND HEAT INSULATING MEMBER

CROSS-REFERENCE TO RELATED APPLICATION

This application is based upon and claims the benefit of priority from Japanese Patent Application No. 2016-251378, filed on Dec. 26, 2016, the entire contents of which are incorporated herein by reference.

TECHNICAL FIELD

The present disclosure relates to a technical field in which a film forming process is performed on a substrate held in a substrate holder in a vertical reaction container.

BACKGROUND

In order to manufacture a semiconductor product, there may be a case where a batch type vertical heat treatment apparatus which collectively performs a film forming process such as CVD (Chemical Vapor Deposition) or the like on a plurality of semiconductor wafers (hereinafter referred to as "wafers") as substrates to be processed is used. In that case, the wafers are transferred to a wafer boat as a vertical substrate holder and are supported in multiple stages in a shelf shape. The substrate holder is loaded into a vertical reaction container (reaction tube) constituting the vertical heat treatment apparatus, the interior of which is kept in a vacuum atmosphere. Then, a film forming gas is supplied and film formation is performed in a state in which the interior of the reaction container is heated.

When forming a film on each of the wafers in this manner, in the above-described substrate holder, there may be a case where, for example, a plurality of dummy wafers not intended for manufacturing semiconductor products are held on the upper side and the lower side of the wafer group held in a shelf shape as described above. By virtue of the dummy wafers, the wafers respectively held on the upper and lower sides of the substrate holder are insulated from outside of a substrate holding region of the substrate holder. As a result, the temperature of the wafers can be kept relatively high, and the film thicknesses of the films formed on the wafers held by the substrate holder can be made uniform. In the related art, there is known a technique in which a wafer mounting portion in a wafer boat is configured by a ring member and a film forming gas is consumed by the ring member so as to adjust a film forming gas concentration in the peripheral portion of the wafer, thereby increasing the film thickness in the peripheral portion of the wafer.

In order to comply with the characteristics of an etching apparatus that etches a wafer after film formation, and so forth, there may be a case where film formation is required to be performed so that the film thickness in the peripheral portion of a wafer becomes larger than the film thickness in the central portion of the wafer. However, when a silicon (Si) film is formed by supplying a monosilane ($SiH_4$) gas as a film forming gas to the wafer group held by the substrate holder in the aforementioned vertical heat treatment apparatus from the lower side, it was confirmed that in a plurality of wafers held on the lower side of the wafer boat, the Si film is formed so that the film thickness in the peripheral portion becomes smaller than the film thickness in the central portion.

Presumably, this is because when the $SiH_4$ gas supplied from the lower side of the wafer group reaches the peripheral portions of the wafers disposed on the lower side of the wafer boat, the $SiH_4$ gas is not sufficiently heated and not sufficiently decomposed to produce Si in the peripheral portions of the wafers. As shown in the evaluation test described later, it is possible to adjust the in-plane film thickness distribution by carrying out the processing without mounting the dummy wafer on the lower side of the wafer group. However, if the dummy wafer is not mounted, the uniformity of the film thickness between the wafers decreases. In this way, a film thickness in the plane of the wafer having a desirable shape and the uniformity of the film thickness between the wafers are in a trade-off relationship. In the related art, there is not presented a method for solving such a problem.

There has been a demand for a technique capable of limiting film thickness variations between wafers W and adjusting a film thickness distribution in the plane of a wafer. The adjustment of the film thickness distribution in the plane of the wafer is not limited to the adjustment of the film thickness between the central portion and the peripheral portion of the wafer as described above, but may include limiting film thickness variations in the plane of the wafer. The uniformity of the film thickness between the wafers and the uniformity of the film thickness in the plane of the wafer are affected by the distribution of a film forming gas such as a $SiH_4$ gas or the like in a reaction container. A demand has existed for a technique for appropriately distributing the film forming gas.

SUMMARY

Some embodiments of the present disclosure provide a technique capable of, when performing a film forming process on a plurality of substrates held in a shelf shape by a substrate holder, adjusting the film thickness distribution in the plane of the substrate held on the upper side or the lower side of the substrate holder among the substrate group and increasing the uniformity of the film thickness between the substrates.

According to one embodiment of the present disclosure, there is provided a film forming apparatus for performing a film forming process on a plurality of substrates by heating the substrates with a heating part in a state in which the substrates are held in a shelf shape by a substrate holder in a vertical reaction container, including: an exhaust part configured to evacuate an interior of the reaction container so as to form a vacuum atmosphere; a gas supply part configured to supply a film forming gas into the reaction container kept in the vacuum atmosphere; a first heat insulating member provided above or below an arrangement region of the plurality of substrates in the substrate holder so as to overlap with the arrangement region and configured to thermally insulate the arrangement region from an upper region above the arrangement region or to thermally insulate the arrangement region from a lower region below the arrangement region in the reaction container; and a through-hole provided in the first heat insulating member at a position overlapping with central portions of the substrates so as to adjust a temperature distribution in a plane of each of the substrates held in a vicinity of the first heat insulating member.

According to another embodiment of the present disclosure, there is provided a film forming method using a film forming apparatus for performing a film forming process on a plurality of substrates by heating the substrates with a heating part in a state in which the substrates are held in a shelf shape by a substrate holder in a vertical reaction container, including: by an exhaust part, evacuating an interior of the reaction container so as to form a vacuum atmosphere; by a gas supply part, supplying a film forming gas into the reaction container kept in the vacuum atmosphere; and by a heat insulating member provided above or below an arrangement region of the plurality of substrates in the substrate holder so as to overlap with the arrangement region, thermally insulating the arrangement region from an upper region above the arrangement region or thermally insulating the arrangement region from a lower region below the arrangement region in the reaction container, wherein the heat insulating member includes a through-hole provided in the heat insulating member at a position overlapping with central portions of the substrates so as to adjust a temperature distribution in a plane of each of the substrates held in a vicinity of the heat insulating member.

According to another embodiment of the present disclosure, there is provided a heat insulating member used for a film forming apparatus for performing a film forming process on a plurality of substrates by heating the substrates with a heating part in a state in which the substrates are held in a shelf shape by a substrate holder in a vertical reaction container, the heat insulating member including: a through-hole provided at a position overlapping with central portions of the substrates so as to adjust a temperature distribution in a plane of each of the substrates held in a vicinity of the heat insulating member, wherein the heat insulating member is provided above or below an arrangement region of the plurality of substrates in the substrate holder so as to overlap with the arrangement region and is configured to thermally insulate the arrangement region from an upper region above the arrangement region or to thermally insulate the arrangement region from a lower region below the arrangement region in the reaction container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
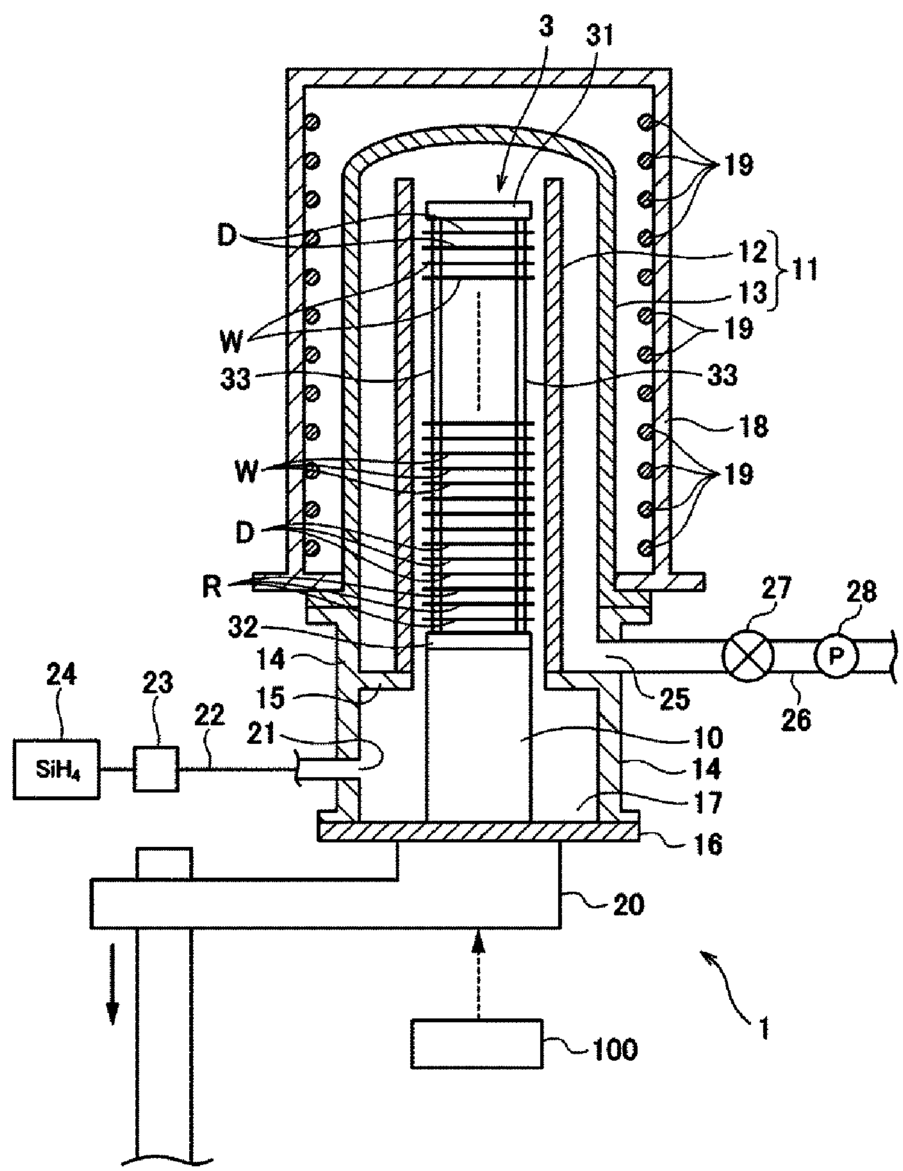
FIG. 1 is a vertical sectional side view of a vertical heat treatment apparatus according to a first embodiment of the present disclosure.

A vertical heat treatment apparatus 1 according to a first embodiment of a film forming apparatus of the present disclosure will be described with reference to a vertical sectional side view of FIG. 1. In this vertical heat treatment apparatus 1, a $SiH_4$ gas is supplied as a film forming gas to a wafer W which is a circular substrate to be processed. A Si film is formed on the wafer W by CVD. The wafer W is a substrate from which a semiconductor device is manufactured. The wafer W is made of, for example, silicon. The diameter of the wafer W is, for example, 300 mm. Furthermore, the vertical heat treatment apparatus 1 is provided with a reaction container 11 which is a substantially cylindrical vacuum container whose longitudinal direction is oriented in the vertical direction. The reaction container 11 has a double-tube structure composed of an inner tube 12 and an outer tube 13 with a ceiling configured to cover the inner tube 12 and formed to have a certain distance from the inner tube 12. The inner tube 12 and the outer tube 13 are made of a heat resistant material, for example, quartz.

A manifold 14 formed in a cylindrical shape and made of stainless steel (SUS) is arranged below the outer tube 13. The manifold 14 is airtightly connected to the lower end of the outer tube 13. Furthermore, the inner tube 12 protrudes from the inner wall of the manifold 14 and is supported by a support ring 15 integrally formed with the manifold 14.

A lid 16 is disposed below the manifold 14. The lid 16 is configured to be vertically movable between a raised position and a lowered position by a boat elevator 20. FIG. 1 shows the lid 16 located at the raised position. In the raised position, the lid 16 closes an opening portion 17 of the reaction container 11 on the lower side of the manifold 14, thereby hermetically sealing the inside of the reaction container 11. A mounting part 10 is provided on the upper portion of the lid 16. A wafer boat 3 as a substrate holder is mounted on the mounting part 10. The wafer boat 3 will be described in detail later. A heat insulating body 18 is provided around the reaction container 11 so as to surround the reaction container 11. A heater 19 as a heating part composed of, for example, a resistance heating body, is provided on the inner wall surface of the heat insulating body 18. The heater 19 is capable of heating the interior of the reaction container 11.

In the manifold 14, a film forming gas introduction port 21 is opened below the support ring 15. The film forming gas introduction port 21 is positioned lower than the lower end of the wafer boat 3 which is loaded into the reaction container 11 in order to perform the film forming process. The downstream end of a film forming gas introduction pipe 22 is connected to the film forming gas introducing port 21. The upstream end of the film forming gas introduction pipe 22 is connected via a gas supply mechanism 23 to a supply source 24 of a $SiH_4$ gas which is a film forming gas. The gas supply mechanism 23 is provided with a valve and a mass flow controller and is configured so as to be able to control the flow rate of a $SiH_4$ gas as a film forming gas supplied from the gas supply source 24 to the film forming gas introduction port 21.

Furthermore, in the manifold 14, an exhaust port 25 is opened on the side surface of the manifold 14 above the support ring 15. An exhaust gas and the like generated in the inner tube 12 are exhausted to the exhaust port 25 through a space formed between the inner tube 12 and the outer tube 13. An exhaust pipe 26 is airtightly connected to the exhaust port 25. In the exhaust pipe 26, a valve 27 and a vacuum pump 28 are provided in this order from the upstream side thereof. By adjusting the opening degree of the valve 27, the pressure in the reaction container 11 is controlled to a desired pressure. The exhaust pipe 26, the valve 27 and the vacuum pump 28 constitute an exhaust part.

Figure 2:
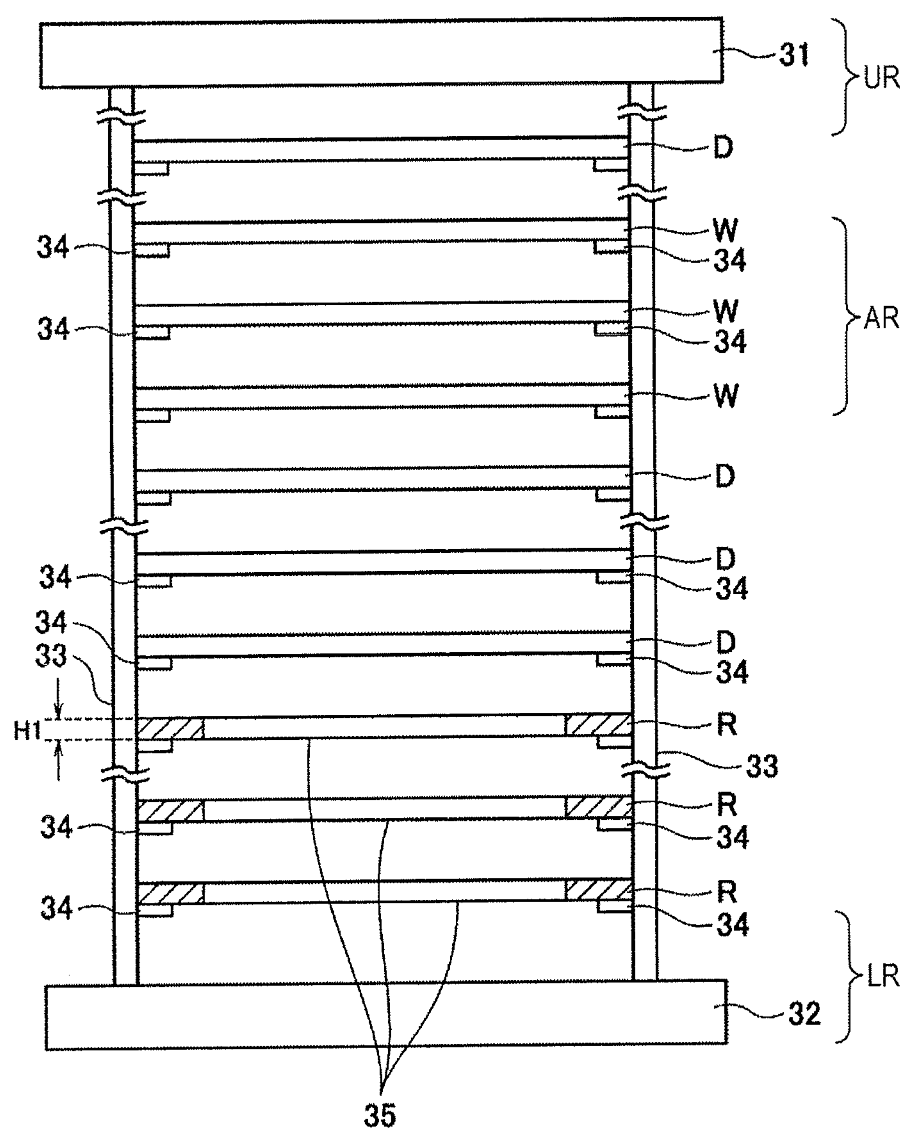
FIG. 2 is a side view of a wafer boat loaded into the vertical heat treatment apparatus.
Figure 3:
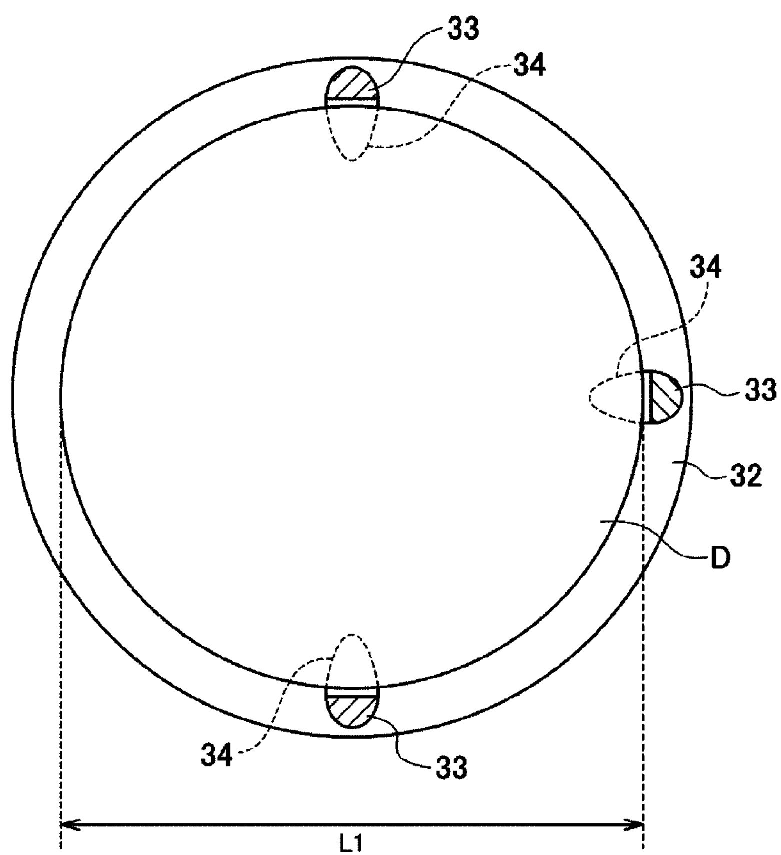
FIG. 3 is a plan view of a dummy wafer mounted on the wafer boat.
Figure 4:
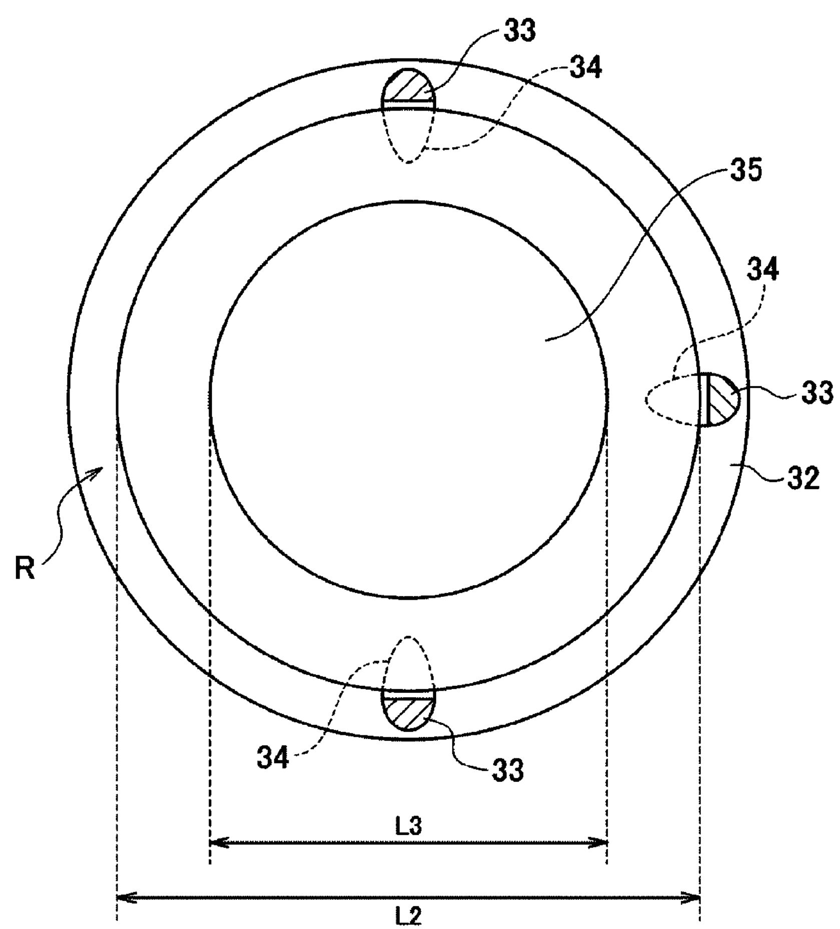
FIG. 4 is a plan view of a ring plate mounted on the wafer boat.

Subsequently, the wafer boat 3 will be further described with reference to the schematic side view of FIG. 2 and the horizontal sectional plan view of FIGS. 3 and 4. FIG. 3 shows the upper surface of a dummy wafer D which is a second heat insulating member to be described later. FIG. 4 shows the upper surface of a ring plate R which is a first heat insulating member to be described later. The wafer boat 3 is made of quartz and is provided with a circular top plate 31 and a circular bottom plate 32 facing each other. The top plate 31 and the bottom plate 32 are horizontally connected to one end and the other end of three support columns 33 extending up and down in the vertical direction. The support columns 33 are provided at intervals along the circumferential direction of the top plate 31 and the bottom plate 32. Tongue-like support portions 34 extend from the support columns 33 toward the central portions of the top plate 31 and the bottom plate 32 in a plan view.

The support portions 34 are provided in multiple stages. Wafers W can be horizontally held on the support portions 34 having different heights. Therefore, the wafers W are held in a shelf shape in multiple stages on the wafer boat 3. The region on each of the support portions 34 on which the wafer W can be mounted is referred to as a slot. For example, 156 slots are provided in the wafer boat 3. In the following description, numbers 1 to 156 are appended to the respective slots. The slots on the upper stage side are assigned smaller numbers. However, in the respective figures, the numbers of the slots are not shown. Since the support portions 34 are disposed at equal intervals in the vertical direction, the slots are also arranged at equal intervals.

Meanwhile, the dummy wafer D or the ring plate R can also be horizontally mounted in the slot. Thus, any one of the wafer W, the dummy wafer D and the ring plate R can be selected and mounted in one slot. In the first embodiment, it is assumed that a film forming process is performed on the wafers W, for example, in a state in which the dummy wafers D are mounted in the slots 1 through 4, the wafers W are mounted in the slots 5 through 134, the dummy wafers D are mounted in the slots 135 through 145, and the ring plates R are mounted in the slots 147 through 156. Therefore, the slots 5 through 134 on which the wafers W are mounted are configured as the arrangement region of the wafers W. Furthermore, the dummy wafers D and the ring plates R are mounted in the same manner as the wafers W as described above, whereby the dummy wafers D and the ring plates R are disposed in the wafer boat 3 so as to overlap with the arrangement region of the wafers W. Incidentally, the slot 146 is kept in a state in which any one of the wafers W, the dummy wafers D and the ring plates R is not mounted, i.e., an empty state.

The dummy wafer D is a substrate not intended for manufacturing a semiconductor device and is formed in the same shape as the wafer W. Therefore, the diameter L1 of the dummy wafer D shown in FIG. 3 is 300 mm. The dummy wafer D is made of, for example, silicon. Subsequently, the ring plate R will be described. The ring plate R is, for example, an annular plate made of quartz. The thickness H1 of the ring plate R (see FIG. 2) is 1 mm to 3 mm. The ring plate R is provided with a circular through-hole 35 that pierces the ring plate R in the thickness direction. The center of the through-hole 35 coincides with the center of the ring plate R. The outer diameter L2 of the ring plate R shown in FIG. 4 is 300 mm. The diameter L3 of the through-hole 35 is, for example, 200 mm.

In this way, the wafer W, the dummy wafer D and the ring plate R have the same outer diameter and are mounted in the respective slots at the same position in a plan view. That is, the wafer W, the dummy wafer D and the ring plate R are supported by the wafer boat 3 so as to overlap with one another. By forming the through-hole 35 of the ring plate R as described above, when the wafer W, the dummy wafer D and the ring plate R are supported on the wafer boat 3 as described above, the through-hole 35 of the ring plate R overlaps with the central portion of the wafer W and the central portion of the dummy wafer D.

In the film forming process, the interior of the reaction container 11 is heated by the heater 19. During this heating, the dummy wafers D and the ring plates R mounted in the slots 135 to 156 as described above serve to insulate a plurality of wafers W existing on the lower side among the group of wafers W mounted on the wafer boat 3, from a region having a relatively low temperature below the slots 135 to 156 (hereinafter referred to as a lower low-temperature region) in the reaction container 11. In other words, the wafers W mounted in a plurality of consecutive slots including the slot 134 are insulated from the lower low-temperature region. The dummy wafers D mounted in the slots 1 to 4 insulate a plurality of wafers W existing on the upper side among the group of wafers W from the upper region above the slots 1 to 4 in the reaction container 11.

The central portion of the ring plate R is open as described above. Therefore, as for the dummy wafer D mounted in the slots 135 to 145 and the plurality of wafers W existing on the lower side (hereinafter referred to as wafers W in the lower side of the arrangement region) among the group of wafers W, the peripheral portion is more insulated than the central portion from the lower low-temperature region. In other words, as for the wafers W in the lower side of the arrangement region and the dummy wafers D, the amount of heat dissipation in the central portion is relatively large. Thus, the temperature distribution in the plane of the wafer W in the lower side of the arrangement region can be controlled by the ring plate R. If the wafer W is disposed just above the ring plate R, there is a concern that the heat dissipation in the central portion of the wafer W disposed just above the ring plate R becomes too large. For this reason, as described above, the dummy wafer D is disposed between the ring plate R and the wafer W to limit excessive heat dissipation in the central portion of the wafer W.

The vertical heat treatment apparatus 1 includes a control part 100 in the form of a computer. The control part 100 is provided with a program. This program incorporates a group of steps so that control signals can be outputted to the respective parts of the vertical heat treatment apparatus 1 to control the operations of the respective parts so that a series of film forming processes described later can be performed on the wafers W. More specifically, the control signals are outputted so as to control the vertical movement of the lid 16 by the boat elevator 20, the output of the heater 19 (i.e., the temperature of the wafer W), the opening degree of the valve 27, the flow rate of the $SiH_4$ gas supplied into the reaction container 11 by the gas supply mechanism 23, and the like. The program is stored in the control part 100 in a state in which the program is stored in a storage medium such as a hard disk, a flexible disk, a compact disk, a magneto-optical disk (MO), a memory card or the like.

Figure 5:
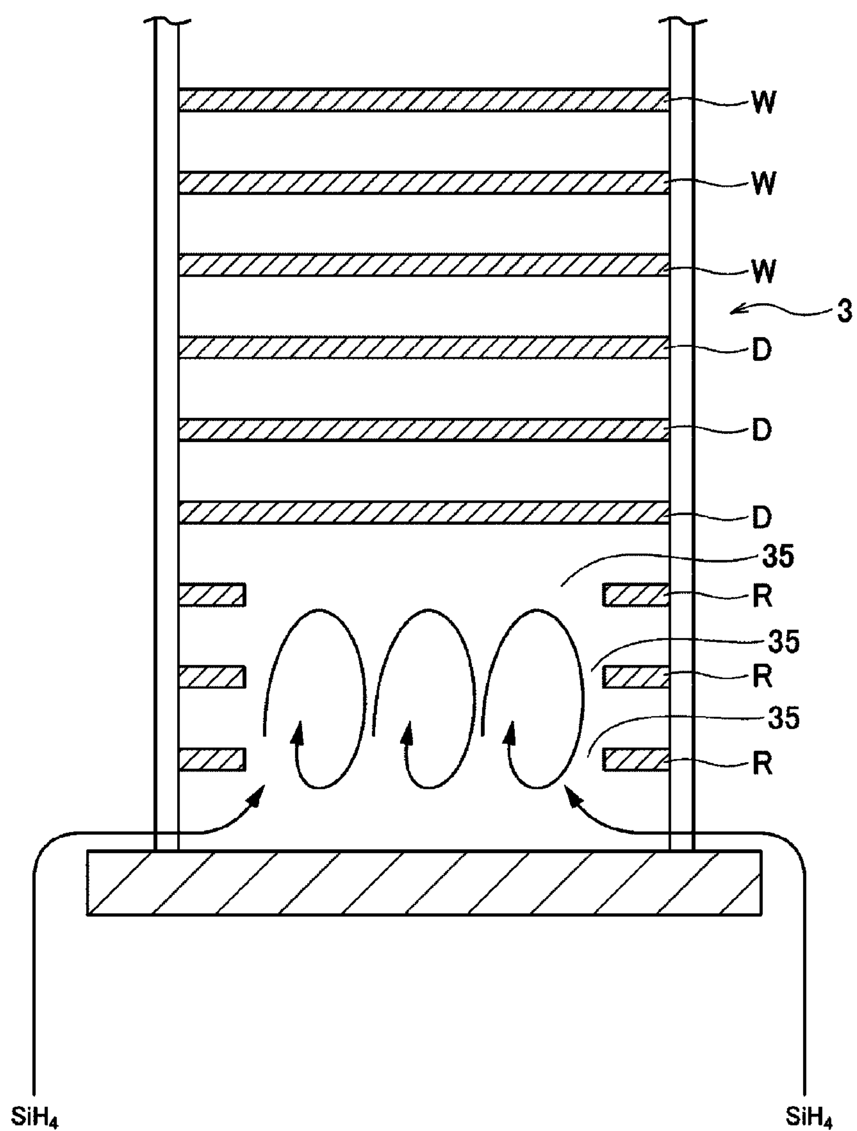
FIG. 5 is a schematic diagram showing the flow of a gas around the wafer boat during a film forming process.
Figure 6:
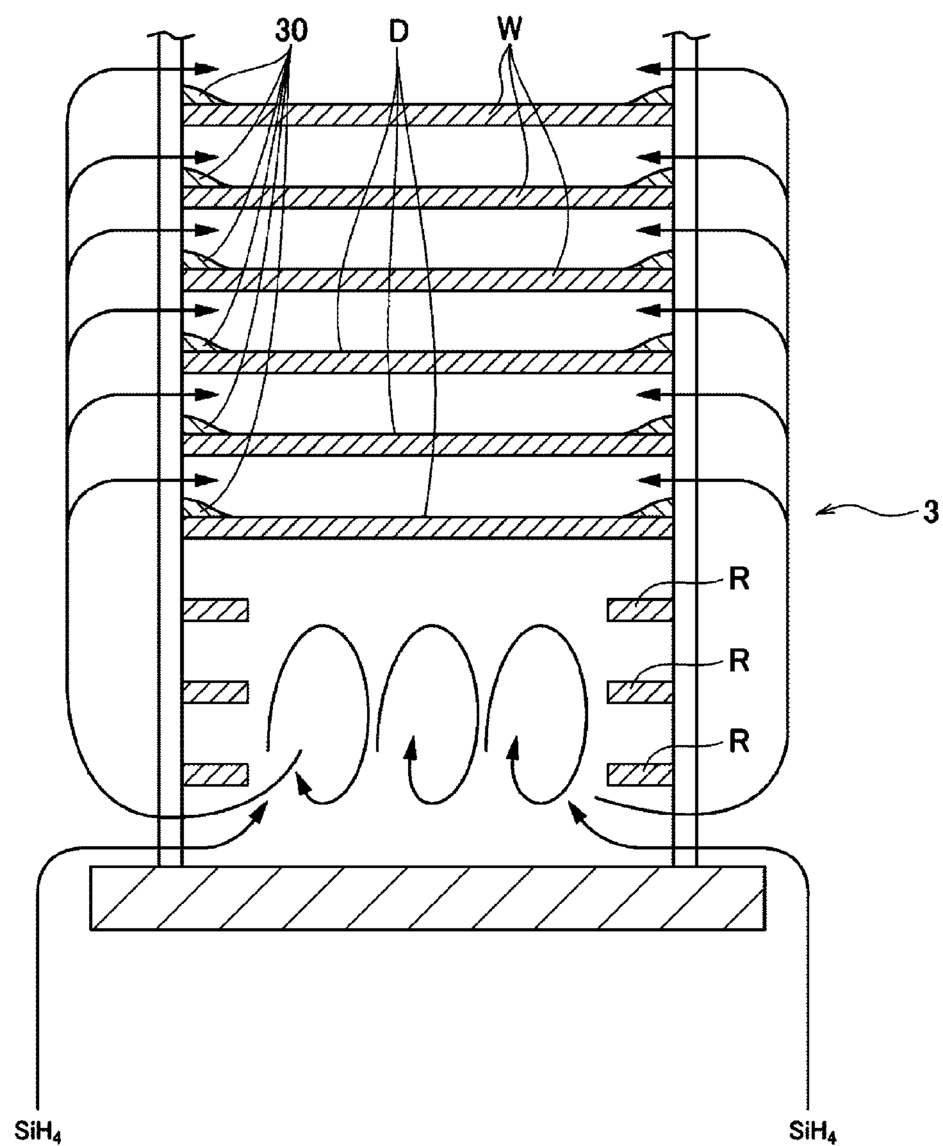
FIG. 6 is a schematic diagram showing the flow of a gas around the wafer boat during a film forming process.
Figure 7:
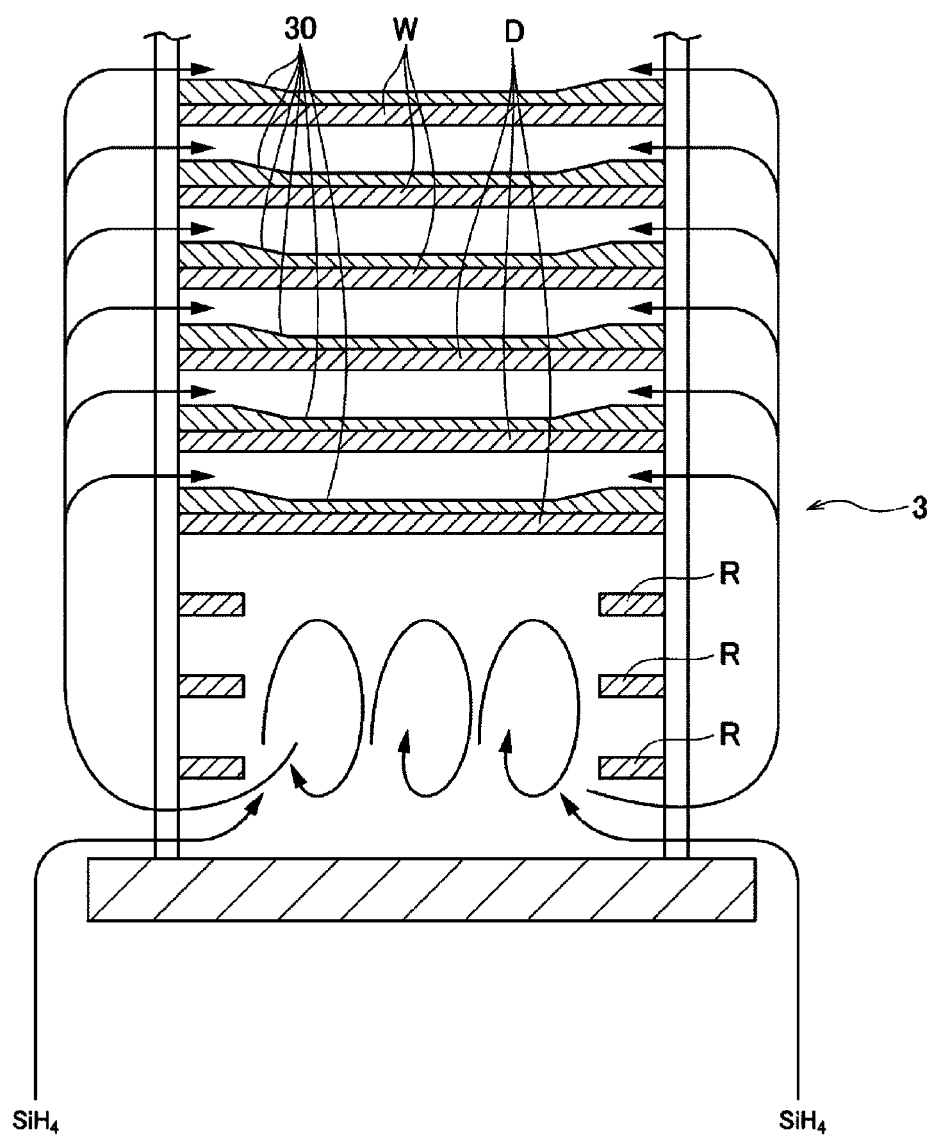
FIG. 7 is a schematic diagram showing the flow of a gas around the wafer boat during a film forming process.

Subsequently, the film forming process performed in the vertical heat treatment apparatus 1 will be described with reference to FIGS. 5 to 7, which are schematic diagrams showing the vertical cross section of the lower side of the wafer boat 3. In FIGS. 5 to 7, there are shown the wafers W in the lower side of the arrangement region existing on the lower side among the group of wafers W mounted on the wafer boat 3, the dummy wafers D mounted on the lower side of the wafer boat 3 and the ring plates R. The flow of the $SiH_4$ gas flowing around the lower side of the wafer boat 3 is indicated by arrows. In FIGS. 5 to 7, the illustration of the support portions 34 of the wafer boat 3 is omitted.

First, the wafers W, the dummy wafers D and the ring plates R are respectively loaded and held in the aforementioned slots of the wafer boat 3 by a transfer mechanism (not shown). Thereafter, the wafer boat 3 is mounted on the lid 16 located at the lowered position. Then, the lid 16 moves up toward the raised position, the wafer boat 3 is carried into the reaction container 11, the opening portion 17 of the reaction container 11 is closed by the lid 16, and the interior of the reaction container 11 is hermetically sealed. Subsequently, the interior of the reaction container 11 is evacuated to a vacuum atmosphere having a predetermined pressure, and the interior of the reaction container 11 is heated to a predetermined temperature by the heater 19.

As described above, due to the shape of the ring plates R, the degree of heat insulation with respect to the lower low-temperature region below the region where the ring plates R are disposed is large in the peripheral portions of the wafers W in the lower side of the arrangement region. In the central portions of the wafers W in the lower side of the arrangement region, the degree of heat insulation with respect to the lower low-temperature region is small. Due to such a difference in the degree of heat insulation, a temperature distribution is formed so that the temperature of the peripheral portion in the plane of the wafer W in the lower side of the arrangement region becomes relatively large. In addition, by performing the heat insulation in this way, it is possible to reduce excessive reduction in the temperature of the wafer W in the lower side of the arrangement region.

Subsequently, a $SiH_4$ gas is supplied from the film forming gas introduction port 21 into the inner tube 12 constituting the reaction container 11. Since the inside of the inner tube 12 is configured to be evacuated from the upper side, the $SiH_4$ gas is heated while being directed upward in the inner tube 12. The $SiH_4$ gas is further heated while staying in the space formed by the through-holes 35 of the ring plates R (FIG. 5). The $SiH_4$ gas is further directed upward in the inner tube 12. The $SiH_4$ gas flows from the upper end of the inner tube 12 to the gap between the inner tube 12 and the outer tube 13. The $SiH_4$ gas is exhausted from the exhaust port 25.

The $SiH_4$ gas heated in the space formed by the through-holes 35 of the ring plates R as described above reaches the height where the wafers W in the lower side of the arrangement region are located, and flows from the peripheral portions to the central portion of the wafers W. The peripheral portions of the arrangement region lower side wafers W are heated to a relatively high temperature by being insulated by the ring plates R. Since the $SiH_4$ gas is heated to a relatively high temperature in this way until the $SiH_4$ gas is supplied to the arrangement region lower side wafers W, a relatively large amount of $SiH_4$ gas is decomposed in the peripheral portions of the wafers W to form a Si film 30 (FIG. 6). Thereafter, the $SiH_4$ gas continues to be supplied to the wafers W in the lower side of the arrangement region. Inasmuch as a relatively large amount of $SiH_4$ gas is decomposed in the peripheral portions of the wafers W in this way, the Si film 30 is formed such that the film thickness in the peripheral portion is larger than the film thickness in the central portion so as to cover the entire front surfaces of the wafers W (FIG. 7).

The $SiH_4$ gas diffused above the height at which the wafers W in the lower side of the arrangement region are located flows through the reaction container 11 for a relatively long time. Thus the $SiH_4$ gas is heated to a relatively high temperature. In this state, the $SiH_4$ gas is supplied to the peripheral portions of the surfaces of the wafers W located at the respective heights above the wafers W in the lower side of the arrangement region so as to flow toward the central portions of the wafers W. As described above, the $SiH_4$ gas is sufficiently heated before being supplied to the surfaces of the wafers W. Thus, a relatively large amount of $SiH_4$ gas is decomposed in the peripheral portions of the respective wafers W. As a result, the Si film 30 is formed so that in the plane of each of the wafers W, the film thickness of the peripheral portion becomes larger than the film thickness of the central portion. After the Si film 30 is thus formed on the surface of each of the wafers W, the supply of the $SiH_4$ gas from the film forming gas introduction port 21 is stopped. The lid 16 moves down so that the wafer boat 3 is unloaded from the reaction container 11. Thereafter, the wafers W, the dummy wafers D and the ring plates R are taken out from the wafer boat 3 by a transfer mechanism (not shown). Eventually, the film forming process is completed.

According to the vertical heat treatment apparatus 1, the film forming process is performed in a state in which the ring plates R are provided under the arrangement region of the wafers W in the wafer boat 3. Since the temperature distribution in the plane of the wafer W in the lower side of the arrangement region is adjusted by the ring plate R, the film thickness of the Si film in the peripheral portion of the wafer W in the lower side of the arrangement region can be made larger than the film thickness of the Si film in the central portion thereof. Since the wafers W in the lower side of the arrangement region are thermally insulated from the lower low-temperature region by the ring plates R, it is possible to prevent each temperature in the plane of the wafer W from becoming a relatively low temperature. Therefore, the film thickness of the Si film of the wafer W in the lower side of the arrangement region is prevented from decreasing with respect to the film thickness of the Si film of other wafers W mounted on the wafer boat 3. Accordingly, it is possible to limit a decrease in the uniformity of the film thickness of the Si film between the respective wafers W mounted on the wafer boat 3.

In order to adjust the temperature distribution in the plane of the wafer W in the lower side of the arrangement region and to thermally insulate the wafer W in the lower side of the arrangement region from the lower low-temperature region as described above, one or more ring plates R may be disposed below the group of wafers W mounted on the wafer boat 3. The arrangement of the ring plates R is not limited to being disposed according to the arrangement described above. For example, in the above arrangement, ten ring plates R are mounted. However, the number of the ring plates R to be mounted is not limited to ten. In addition, the slots in which the ring plates R are mounted are not limited to being vertically continuous slots. One or a plurality of slots in which the ring plates R are not mounted may exist between the slots in which the ring plates R are mounted. In the above arrangement example, an empty slot is arranged between the slots in which the group of dummy wafers D is disposed and the slots in which the group of ring plates R is disposed. However, such an empty slot may not be provided.

Figure 8:
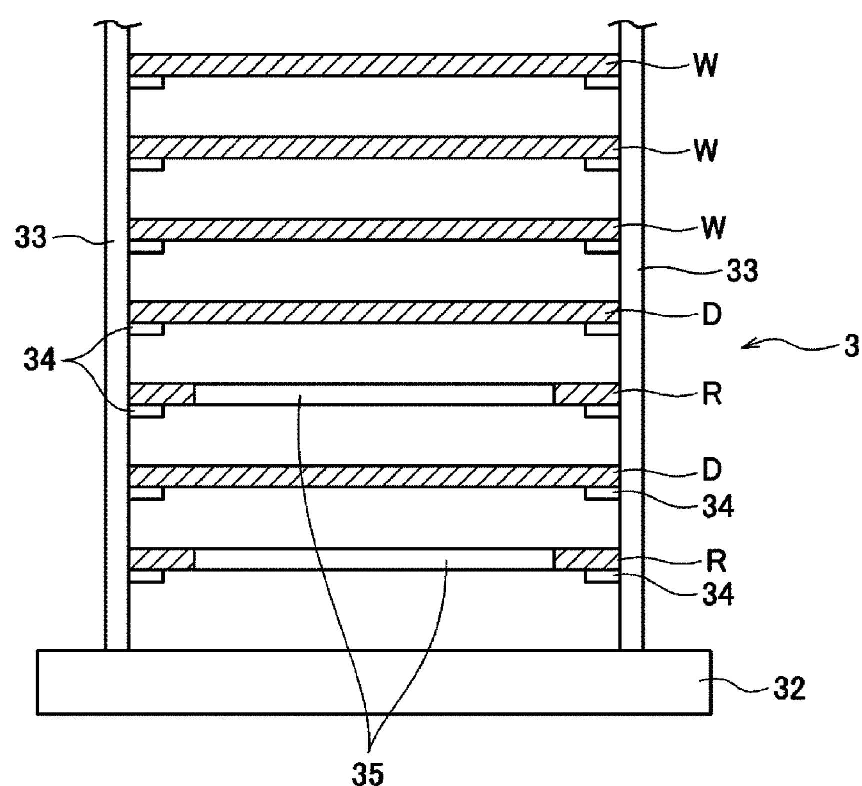
FIG. 8 is a side view of the wafer boat.

Assuming that the wafers W and the dummy wafers D are disposed in the slots as in the arrangement example described above, examples of arrangements of the ring plates R will now be described specifically. For example, the ring plates R may be disposed in the slots 147, 149, 151, 153 and 155, and the slots 146, 148, 150, 152, 154 and 156 may be left empty. The ring plates R may be disposed in the slots 146 to 155, and the slot 156 may be left empty. The ring plates R may be disposed in the slots 147 to 151, and the slots 146 and 152 to 156 may be left empty. In the case where a slot in which the ring plate R is not mounted is provided between a plurality of slots in which the ring plates R are mounted, the slot not mounted with the ring plate R may be left empty or the dummy wafer D may be disposed in the slot not mounted with the ring plate R. Accordingly, for example, as shown in FIG. 8, the ring plates R and the dummy wafers D may be alternately disposed.

Figure 9:
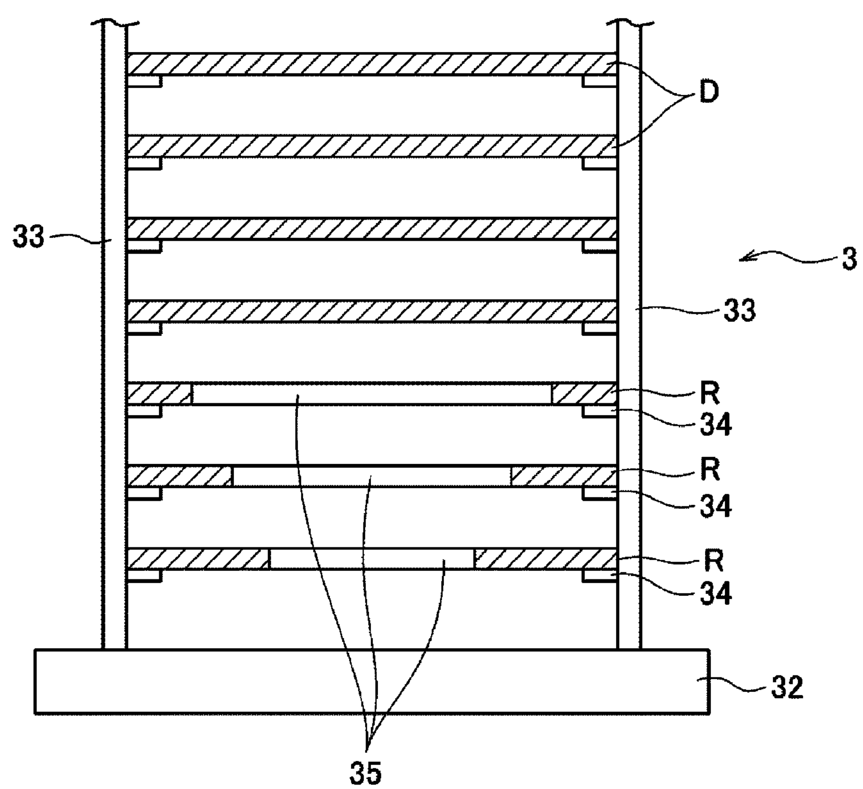
FIG. 9 is a side view of the wafer boat.
Figure 10:
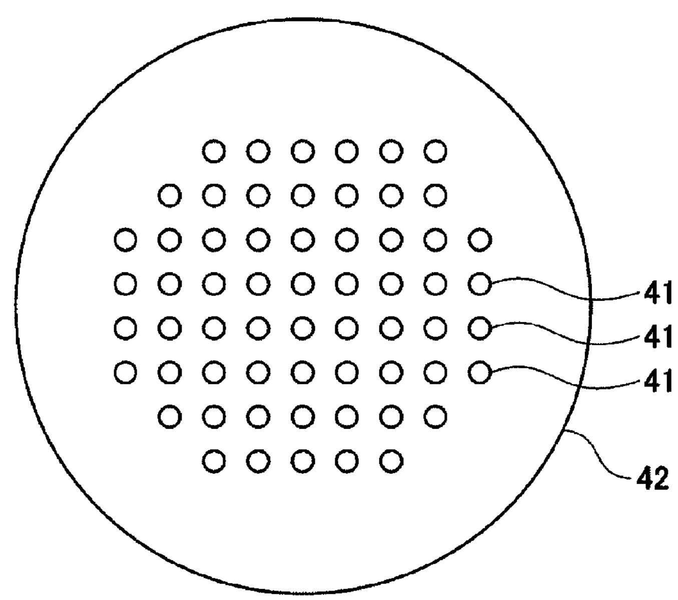
FIG. 10 is a plan view of a heat insulating member other than a ring plate.

The size of the diameter L3 of the through-hole 35 of the ring plate R (see FIG. 4) is not limited to the above example and may be, for example, 150 mm. In addition, the wafer boat 3 is not limited to carrying out the film forming process by mounting the ring plates R having the same diameter L3 of the through-hole 35. For example, FIG. 9 shows an example in which the ring plates R are disposed so that the diameter of the through-hole 35 grows larger toward the slots on the upper side. For example, some of the ring plates R may be missing. It is only necessary to make the amount of heat dissipation in the central portion of the wafer W larger than the amount of heat dissipation in the peripheral portion. Therefore, as the heat insulating member, instead of the ring plate R, a circular plate 42 having a large number of through-holes 41 dispersed in the central portion thereof as shown in FIG. 10 may be mounted on the wafer boat 3. For example, the diameter of the circular plate 42 is set to be the same as the diameter of the wafer W so that the circular plate 42 can be mounted on the wafer boat 3. The through-holes 41 are not formed in the peripheral portion of the circular plate 42. However, if the opening area of the central portion is larger than that of the peripheral portion, just like the ring plate R, the heat dissipation in the central portion of the wafer W can be made larger than that in the peripheral portion of the wafer W. Therefore, the through-holes 41 may also be formed in the peripheral portion of the circular plate 42.

Although the ring plate R is configured to be detachable from the wafer boat 3, the ring plate R may be fixed to the wafer boat 3. Furthermore, the heat insulating member for creating a temperature distribution in the wafer W is not limited to a plate-like shape and may be, for example, an upright cylindrical shape. However, if the heat insulating member is formed in such a cylindrical shape, the volume of the heat insulating member becomes relatively large. Thus, the time from the start of heating of the interior of the reaction container 11 to the arrival at a predetermined temperature is relatively long, and the time from the loading of the wafer boat 3 into the reaction container 11 to the start of the film forming process is prolonged. Accordingly, it is preferable to form the heat insulating member in a plate-like shape just like the ring plate R described above.

In the vertical heat treatment apparatus 1 and the vertical heat treatment apparatuses 4 and 6 to be described later, the mounting part 10 may be rotated by a motor provided below the lid 16, so that the wafer boat 3 can rotate about a vertical axis passing through the centers of the respective wafers W. Furthermore, the film forming gas to be discharged is not limited to the $SiH_4$ gas. Film forming gas for forming various films may be used. In addition, the film formation is not limited to being performed by CVD and may be performed by ALD (Atomic Layer Deposition). In that case, a raw material gas, a reaction gas chemically reacting with the raw material gas and a purge gas for purging the interior of the reaction container 11 after supplying one of the raw material gas and the reaction gas and before supplying the other of the raw material gas and the reaction gas are introduced into the reaction container 11.

Second Embodiment

Figure 11:
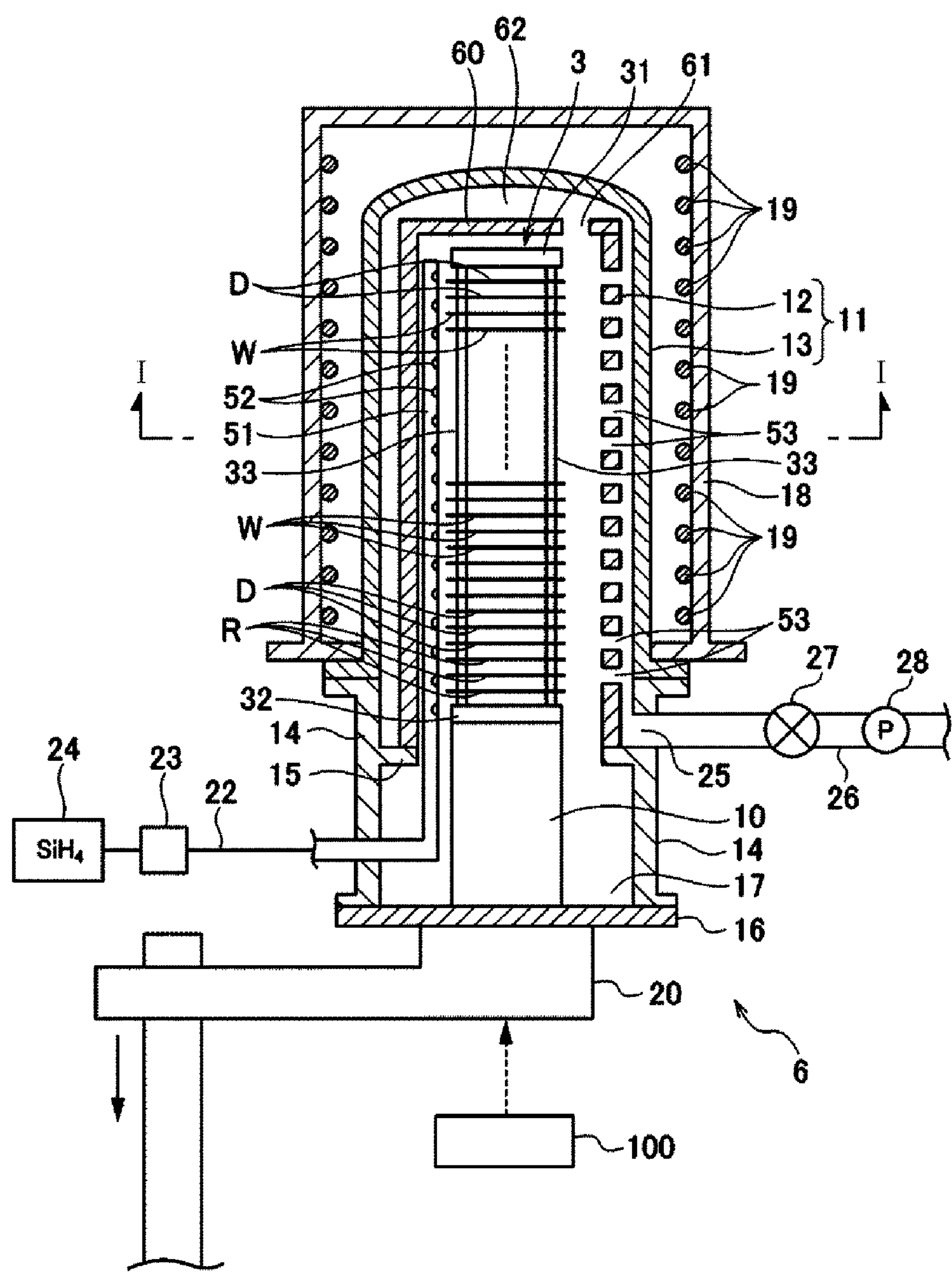
FIG. 11 is a vertical sectional side view of a vertical heat treatment apparatus according to a second embodiment of the present disclosure.
Figure 12:
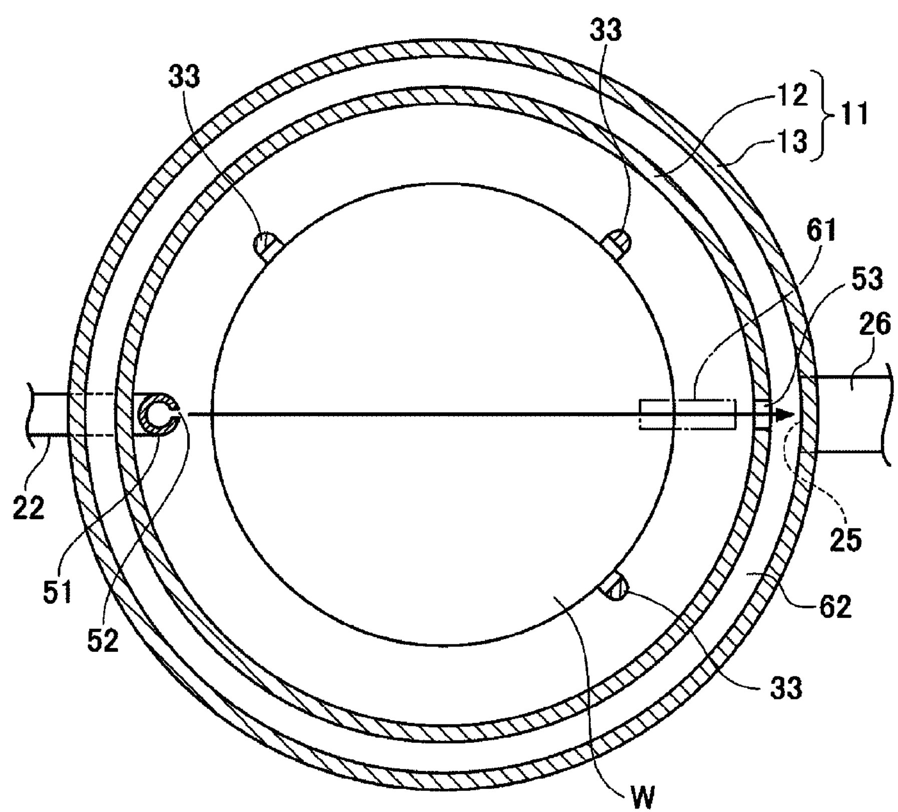
FIG. 12 is a horizontal sectional plan view of the vertical heat treatment apparatus.

Next, a vertical heat treatment apparatus 6 according to a second embodiment of the film forming apparatus will be described with reference to the vertical sectional side view of FIG. 11 while focusing on the differences from the vertical heat treatment apparatus 1. Furthermore, FIG. 12 is a horizontal sectional plan view of a reaction container 11 constituting the vertical heat treatment apparatus 6 of FIG. 9 taken along line I-I. FIG. 12 will be also referred to as appropriate. The arrow in FIG. 12 indicates the flow of a gas in the reaction container 11. In FIGS. 11 and 12, reference numeral 51 denotes an injector horizontally penetrating the manifold 14. The tip portion of the injector 51 is bent in the reaction container 11 and extends vertically upward in the inner tube 12. Reference numeral 52 in FIGS. 11 and 12 denotes discharge holes provided in the tip portion of the injector 51. The discharge holes 52 are horizontally opened. The base end portion of the injector 51 is connected to the film forming gas introduction pipe 22 outside the manifold 14. The injector 51 discharges a $SiH_4$ gas from the respective discharge holes 52 toward the respective slots of the wafer boat 3.

In the side wall of the inner tube 12 of the vertical heat treatment apparatus 6, for example, a plurality of openings 53 is opened at intervals along the vertical direction in a region opposed to the tip portion of the injector 51 across the region where the wafer boat 3 is disposed. In other words, through-holes are provided along the height direction of the inner tube 12. For example, as shown in FIG. 12, when viewed in a plan view, the openings 53 are formed so as to open in the same direction as the exhaust port 25 to which the exhaust pipe 26 is connected. Furthermore, the inner tube 12 is provided with a circular cover 60 so as to close the upper side of the inner tube 12. Thus, the cover 60 constitutes the ceiling portion of the inner tube 12. In the cover 60, a through-hole opened in the thickness direction of the cover 60 is provided as a cover exhaust port 61. In FIG. 12, the cover exhaust port 61 is indicated by a chain line. The center of the cover 60 coincides with the center of the wafer W when viewed in a plan view. In the inner tube 12, the side on which the injector 51 constituting a gas supply part is provided is assumed to be a front side, and the side on which the openings 53 are provided is assumed to be a rear side. In this example, the cover exhaust port 61 is locally opened on the rear side of the center of the cover 60 and is formed in a slit shape extending along the front-rear direction on the diameter of the cover 60.

Furthermore, the space formed between the inner tube 12 and the outer tube 13 is shown as an exhaust space 62. While the $SiH_4$ gas is discharged from the injector 51 to form a film on the wafer W, the exhaust space 62 is evacuated by the exhaust pipe 26, and the interior of the inner tube 12 is evacuated through the openings 53 and the cover exhaust port 61. Since the evacuation is performed in this manner, in the vertical heat treatment apparatus 6, the inner tube 12 may be regarded as the reaction container, and the outer tube 13 may be regarded as an exhaust passage forming member that forms an exhaust passage outside the reaction container. Therefore, the vertical heat treatment apparatus 6 is a film forming apparatus for performing film formation with respect to a plurality of substrates by heating the substrates with a heating part in a state in which the substrates are held in a shelf shape by a substrate holder in a vertical reaction container, including: a gas supply part configured to supply a film forming gas into the reaction container kept in a vacuum atmosphere; first through-holes provided in a side wall of the reaction container along a height direction of the reaction container; a second through-hole provided in a ceiling of the reaction container, and an exhaust part configured to exhaust the film forming gas from the first through-holes and the second through-hole during the supply of the film forming gas.

When supplying the $SiH_4$ gas to the wafer W as described above, the cover 60 of the inner tube 12 serves to prevent the flow of the $SiH_4$ gas near the upper end portion in the inner tube 12 from being disturbed by the evacuation of the exhaust space 62. By providing the cover exhaust port 61 in the cover 60, it is possible to adjust the balance between the supply rate of the $SiH_4$ gas into the inner tube 12 and the discharge rate of the $SiH_4$ gas from the inside of the inner tube 12. More specifically, by performing exhaust from the cover exhaust port 61, it is possible to prevent the $SiH_4$ gas from staying at the upper end portion in the inner tube 12. Thus, as shown in the evaluation tests described later, it is possible to prevent the film thickness of the respective wafers W mounted in the slots existing on the upper side of the wafer boat 3 from becoming too large, to enhance the uniformity of the film thickness between the wafers W, and to prevent the variations of the film thickness in the planes of the wafers W mounted in the slots existing on the upper side from becoming large.

The position at which the cover exhaust ports 61 are provided and the number of the cover exhaust ports 61 are not limited to the above example. For example, the cover exhaust ports 61 may be provided on the front side of the covers 60. However, in order to prevent the film formation gas discharged from the injector 51 from being exhausted before reaching the wafers W, it is preferable that the cover exhaust port 61 is provided on the rear side of the cover 60 as described above. Furthermore, by forming the cover exhaust port 61 along the front-rear direction as described above, it is possible to prevent disturbance of a gas flow otherwise caused by the spreading in the left-right direction of the film forming gas discharged from the injector 51 and to prevent a decrease in the uniformity of the film thickness distribution in the plane of the wafer W. The cover exhaust port 61 is not limited to being formed in a slit shape as described above. For example, a plurality of relatively small holes may be provided as the cover exhaust port 61 along the front-rear direction of the cover 60. Incidentally, the openings 53 for performing exhaust from the side wall of the inner tube 12 may be formed along the vertical direction of the inner tube 12 in order to exhaust the film forming gas with high uniformity in the vertical direction inside the inner tube 12. Therefore, instead of providing the plurality of openings 53 as described above, for example, a slit-shaped opening 53 extending in the vertical direction from the upper end portion to the lower end portion of the side wall of the inner tube 12 may be provided. In the vertical heat treatment apparatus 6, just like the vertical heat treatment apparatus 1, the film forming gas may be supplied from the lower side of the reaction container 11 by the film forming gas introduction port 21 constituting a film forming gas supply part.

In addition, in the vertical heat treatment apparatus 6, for example, as in the first embodiment, the ring plates R are mounted on the wafer boat 3, and the film forming process is performed on the wafers W as described above. Therefore, the second embodiment has the same advantages as those of the first embodiment. However, the above-described effect of the cover 60 is exerted even when the ring plates R are not mounted on the wafer boat 3. That is, in the vertical heat treatment apparatus 6, by carrying out the film forming process in a state in which the ring plates R are mounted on the wafer boat 3, it is possible to surely enhance the uniformity of the film thickness between the wafers W by the action of the ring plates R in addition to the action of the cover 60. In addition, it is possible to adjust the film thickness distribution in the planes of the wafers W disposed on the upper side of the wafer boat 3.

Third Embodiment

Figure 13:
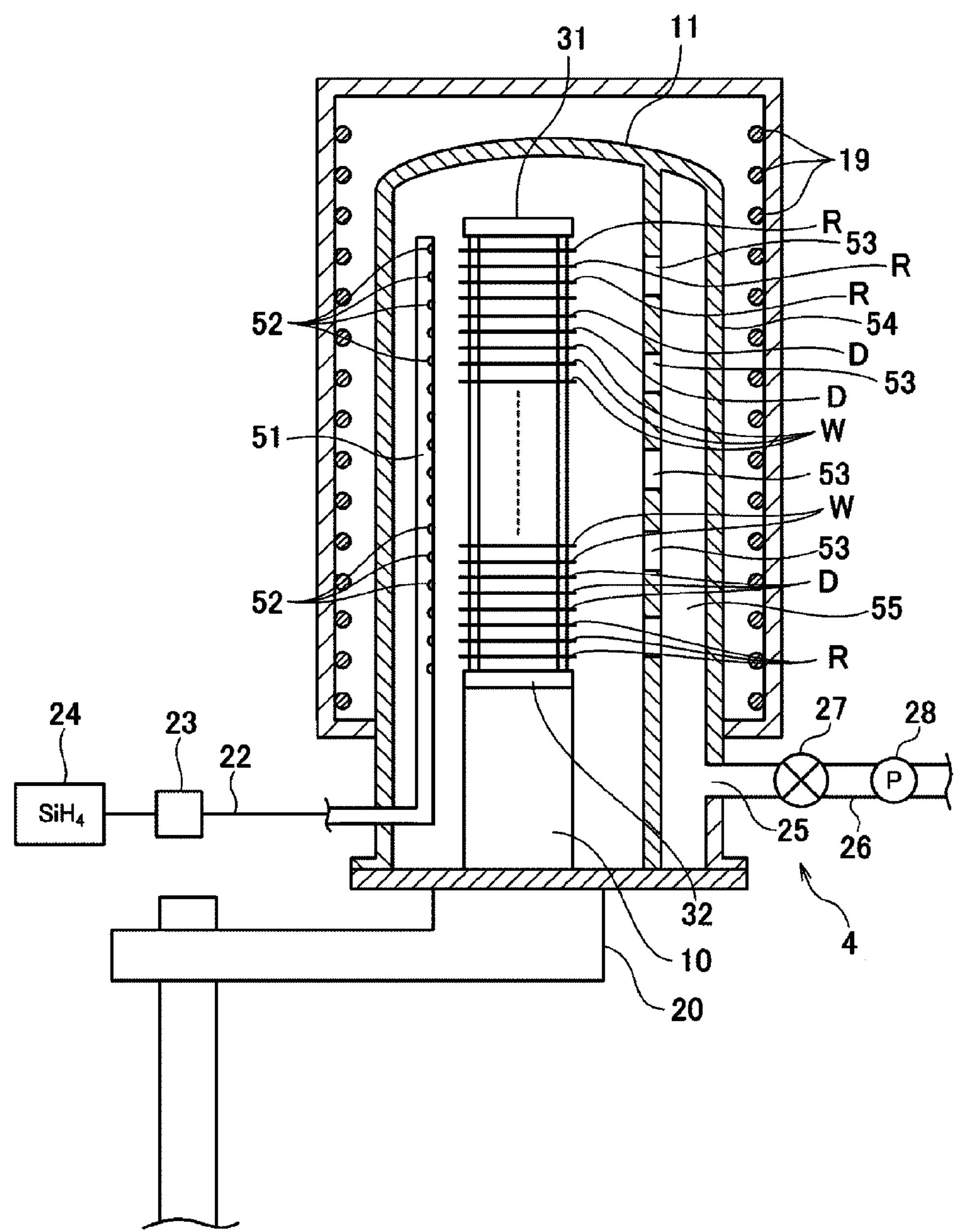
FIG. 13 is a vertical sectional side view of a vertical heat treatment apparatus according to a third embodiment of the present disclosure.

Next, a vertical heat treatment apparatus 4 according to a third embodiment of the film forming apparatus will be described with reference to the vertical sectional side view of FIG. 13 while focusing on differences from the vertical heat treatment apparatus 1. Furthermore, FIG. 14 which is a horizontal sectional plan view of the reaction container 11 constituting the vertical heat treatment apparatus 4 will be referred to as appropriate. In the vertical heat treatment apparatus 4, the flow of a $SiH_4$ gas flowing in the transverse direction is formed in the reaction container 11 to form a Si film on the wafer W. In the vertical heat treatment apparatus 4, the inner tube 12 is not provided, and the reaction container 11 is formed by a member corresponding to the outer tube 13 of the vertical heat treatment apparatus 1. The reaction container 11 is formed in a generally circular shape when viewed in cross section. More specifically, a part of the side wall of the reaction container 11 bulges outward from the reaction container 11 when viewed in cross section, whereby a vertically elongated nozzle accommodating space 50 is formed. Instead of providing the film forming gas introduction port 21 in the manifold 14, an injector 51 is provided so as to horizontally penetrate the manifold 14.

The tip portion of the injector 51 is bent inside the reaction container 11 and extends vertically upward in the nozzle accommodating space 50. In the tip portion of the injector 51 which extends upward in this way, a large number of discharge holes 52 are opened at intervals in the vertical direction so as to horizontally face the wafer boat 3. The downstream end of the film forming gas introduction pipe 22 is connected to the base end of the injector 51 outside the manifold 14 instead of being connected to the film forming gas introduction port 21. The $SiH_4$ gas can be discharged from the discharge holes 52 toward the respective slots of the wafer boat 3.

Figure 14:
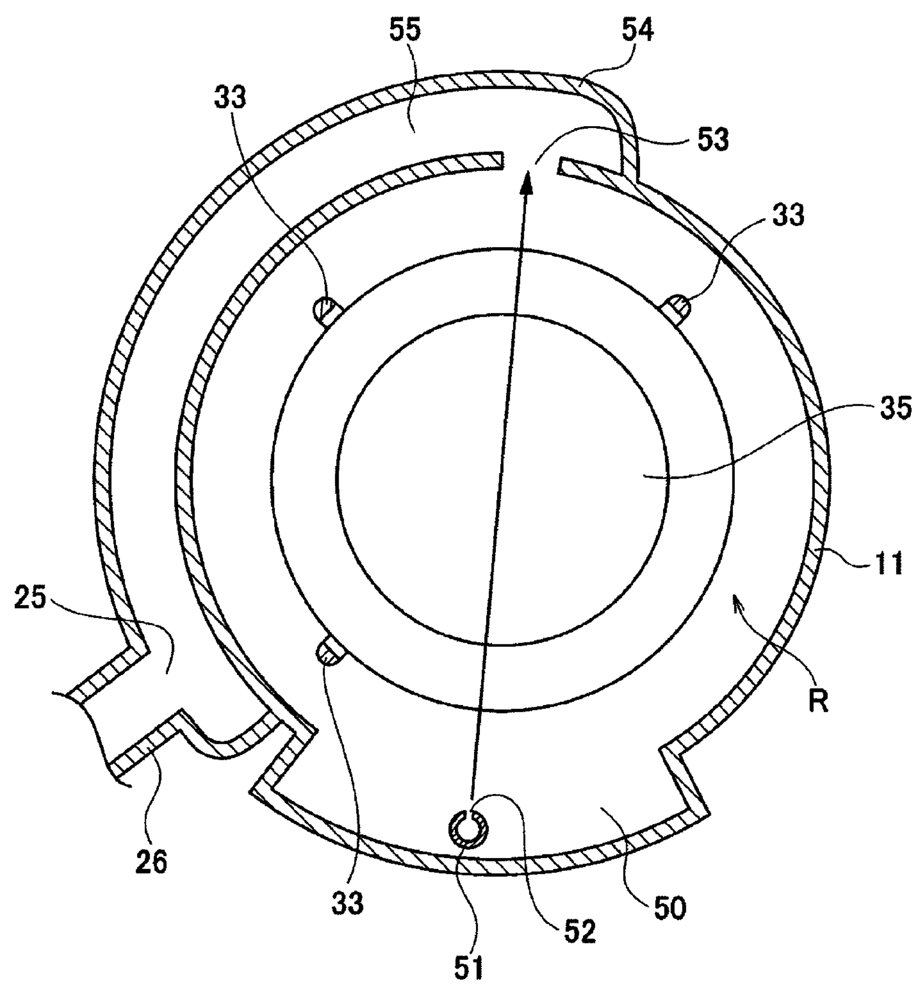
FIG. 14 is a horizontal sectional plan view of the vertical heat treatment apparatus.

In the side wall of the reaction container 11, a plurality of openings 53 is formed at intervals in the vertical direction in the region opposite the tip portion of the injector 51 across the region where the wafer boat 3 is disposed. A cover 54 is provided so as to cover the openings 53 from the outside of the reaction container 11. Therefore, the cover 54 is also a member constituting a part of the side wall of the reaction container. For the sake of convenience of explanation, the cover 54 is shown as if it is distinguished from the reaction container 11. On the outer periphery of the reaction container 11, the cover 54 forms a space 55 extending along the circumference of the reaction container 11 in a cross-sectional view. The upstream end of the exhaust pipe 26 is connected to the cover 54 at a position below the wafer boat 3 and below the region where the openings 53 are formed, thereby evacuating the space 55. As shown in FIG. 14, the exhaust pipe 26 is connected to the cover 54 at a position closer to the injector 51 than the openings 53 in the circumferential direction of the reaction container 11. In FIG. 13, for the sake of convenience of illustration, the exhaust pipe 26 is shown as if it is connected to the cover 54 at a side opposite from the injector 51. During the film forming process, the evacuation of the space 55 and the discharge of the $SiH_4$ gas from the injector 51 are performed in parallel, whereby the gas flow of the $SiH_4$ gas flowing in the transverse direction inside the reaction container 11 can be formed. The arrow in FIG. 14 indicates the gas flow.

In the wafer boat 3, a ring plate R group, a dummy wafer D group, a wafer W group, a dummy wafer D group and a ring plate R group are mounted in this order from the upper side to the lower side. Among the dummy wafer D groups mounted on the wafer boat 3 in this manner, those mounted on the upper side and those mounted on the lower side are referred to as the upper side dummy wafer D group and the lower side dummy wafer D group, respectively. Furthermore, among the ring plate R groups mounted on the wafer boat 3 as described above, those mounted on the upper side and those mounted on the lower side are referred to as the upper side ring plate R group and the lower side ring plate R group, respectively.

Similar to the respective ring plates R and the respective dummy wafers D mounted on the lower side of the wafer boat 3 of the first embodiment, the lower side ring plate R group and the lower side dummy wafer D group thermally insulate the lower side wafers W of the wafer W group from the lower low-temperature region, thereby keeping the temperature of the lower side wafers W relatively high. The lower side ring plate R group adjusts the film thickness distribution of the formed Si film, by adjusting the amount of heat dissipation in the planes of the lower side wafers W and adjusting the temperature distribution in the planes of the lower side wafers W.

The upper side ring plate R group and the upper side dummy wafer D group thermally insulate the upper side wafers W of the wafer W group from the region above the slot 1 in the reaction container 11, thereby adjusting the temperature thereof. Furthermore, the upper side ring plate R group adjusts the film thickness distribution of the Si film formed on each of the arrangement region upper side wafers W, by adjusting the amount of heat dissipation in the planes of the upper side wafers W and adjusting the temperature distribution in the planes of the upper side wafers W.

By disposing the ring plates R on the upper side and the lower side of the wafer W group in this manner, it is possible to thermally insulate the upper side wafers W and the lower side wafer W of the wafer W group from the region above the arrangement region of the wafers W and the region below the arrangement region of the wafers W. This makes it possible to adjust the temperatures of the upper side wafers W and the lower side wafers W and to enhance the uniformity of the film thickness between the wafers W. In addition, with respect to the upper side wafers W and the lower side wafers W, it is possible to adjust the film thickness distribution between the central portion and the peripheral portion.

In the third embodiment, in order to adjust the film thickness distribution of only one of the upper side wafers W and the lower side wafers W, only one of the upper side ring plate R group and the lower side ring plate R group may be provided. In the respective embodiments described above, the ring plates R are used in order to make the film thickness of the peripheral portion larger than the film thickness of the central portion in the plane of the wafer W. However, the present disclosure is not limited to the use of the ring plates R for such a purpose. The ring plates R may be used in order to make the film thickness of the central portion and the film thickness of the peripheral portion uniform. Depending on the type of the film forming gas to be used, it is conceivable that the film thickness of the peripheral portion is made larger than the film thickness of the central portion by using the ring plates R. The ring plates R may be used to create such a film thickness distribution. The configuration of the present disclosure is not limited to the respective embodiments described above. The respective embodiments may be appropriately changed or combined.

(Evaluation Test 1)

Hereinafter, evaluation tests conducted in connection with the present disclosure will be described. In evaluation test 1, a film forming process was performed on the wafers W using the vertical heat treatment apparatus 1 of the first embodiment. The wafers W, the dummy wafers D and the ring plates R were respectively mounted in the slots described in the first embodiment. In other words, the film forming process was performed with the wafers W mounted in the slots 5 to 134, the dummy wafers D mounted in the slots 1 to 4 and 135 to 145, and the ring plates R mounted in the slots 147 to 156. Then, for the respective wafers W subjected to the film forming process, the in-plane film thicknesses of the respective portions were measured, and the average value and the standard deviation were calculated. In comparative test 1, a film forming process was performed under the same conditions as those of evaluation test 1 except that in the wafer boat 3, the ring plates R are not mounted in the slots 147 to 156 and the dummy wafer D is not mounted in the slot 144. Then, for the respective wafers W subjected to the film forming process, the in-plane film thicknesses of the respective portions were measured, and the average value and the standard deviation were calculated.

Figure 15:
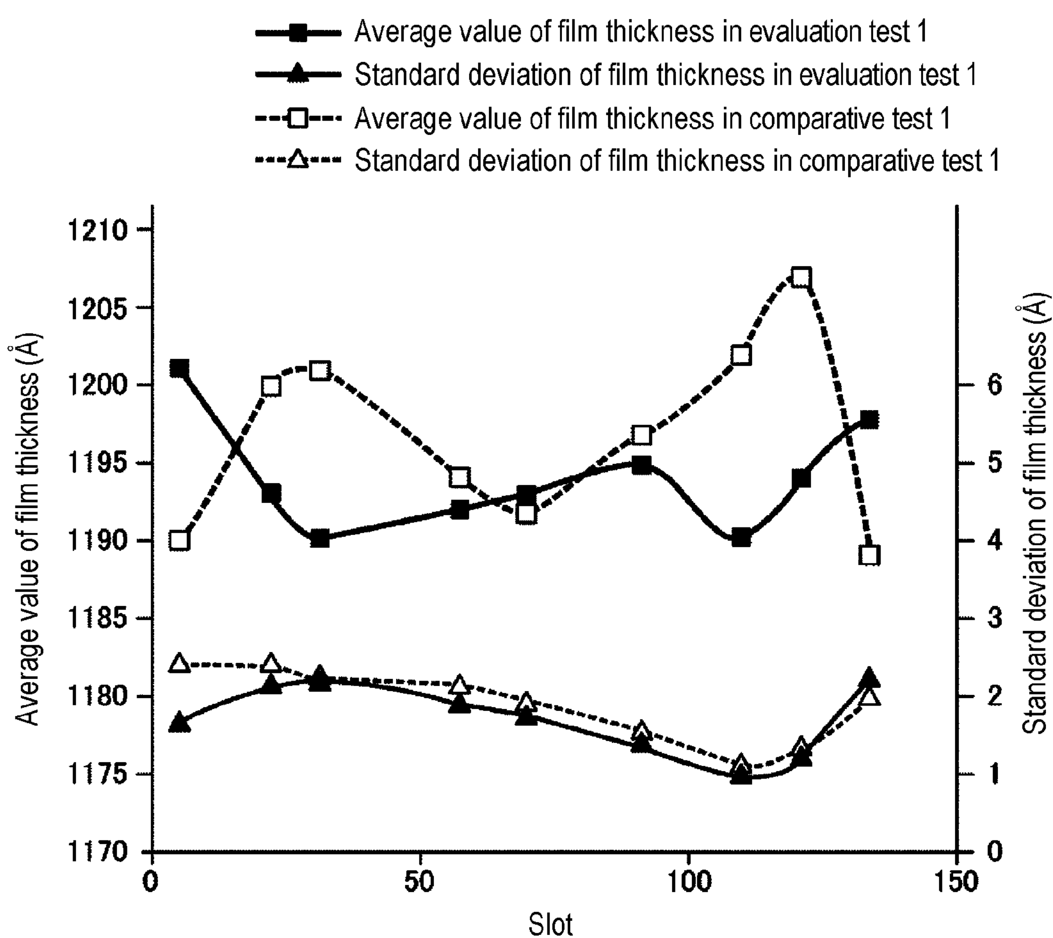
FIG. 15 is a graph showing the results of evaluation tests.

The graph of FIG. 15 shows the results of evaluation test 1 and the result of comparative test 1. The horizontal axis of the graph indicates the serial numbers of slots. The vertical axis of the graph indicates the average value (unit: Å) of the film thicknesses in the plane of the wafer W and the standard deviation (unit: Å) of the film thicknesses in the plane of the wafer W. In the graph, for evaluation test 1, the average value of the film thicknesses is shown by black square plots, and the standard deviation of the film thicknesses is shown by black triangle plots. In the graph, for comparative test 1, the average value of the film thicknesses is shown by white square plots, and the standard deviation of the film thicknesses is shown by white triangle plots. As shown in the graph, the standard deviations of the film thicknesses of the wafers W mounted in the same slots are substantially the same in evaluation test 1 and comparative test 1. As for the average value of the film thicknesses of the wafers W mounted on the lower end portion of the wafer boat 3, the value of evaluation test 1 is larger than the value of comparative test 1.

From the results of evaluation test 1, it was confirmed that by mounting the ring plates R in the slots of the lower end portion of the wafer boat 3, it is possible to increase the average value of the film thicknesses of the wafers W mounted in the vicinity of the ring plates R without largely changing the degree of the variation in film thickness in the plane of each wafer W. As for the wafers W mounted in the slots of the lower end portion of the wafer boat 3, it was confirmed that the film thickness in the peripheral portion is larger than the film thickness in the central portion in evaluation test 1, and the film thickness in the peripheral portion is smaller than the film thickness in the central portion in comparative test 1. Thus, it was confirmed that the film thickness distribution of the wafers W mounted in the vicinity of the ring plates R can be changed by mounting the ring plates R.

(Evaluation Test 2)

In evaluation test 2-1, a film forming process was performed on the wafers W using the vertical heat treatment apparatus 1. In evaluation test 2-1, the film forming process was performed while mounting the dummy wafers D in the slots 135 to 156 and mounting the wafers W and the dummy wafers D in other slots as in the first embodiment. Then, for the respective wafers W subjected to the film forming process, the in-plane film thicknesses of the respective portions were measured, and the average value and the standard deviation were calculated. In evaluation test 2-2, a film forming process was performed as in evaluation test 2-1 except that the slots 135 to 156 are left empty. Then, for the respective wafers W subjected to the film forming process, the in-plane film thicknesses of the respective portions were measured, and the average value and the standard deviation were calculated.

Figure 16:
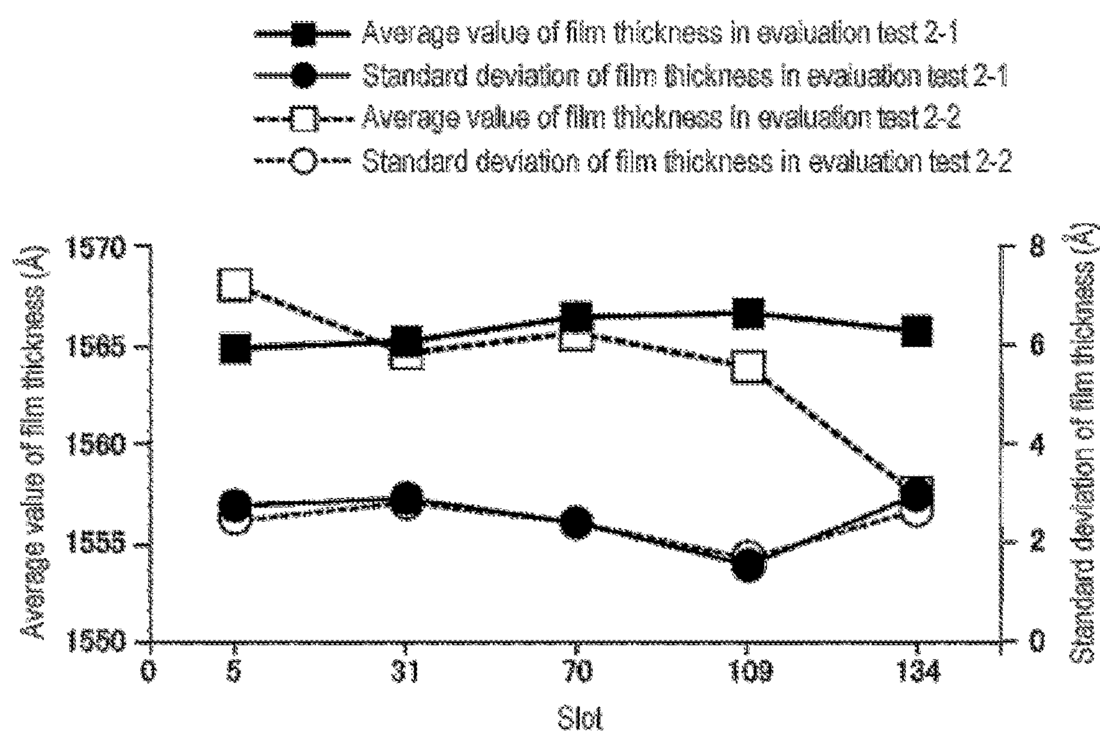
FIG. 16 is a graph showing the results of evaluation tests.

The graph of FIG. 16 shows the results of evaluation tests 2-1 and 2-2. The horizontal axis of the graph indicates the serial numbers of slots. The vertical axis of the graph indicates the average value (unit: nm) of the film thicknesses in the plane of the wafer W and the standard deviation (unit: Å) of the film thicknesses in the plane of the wafer W. In the graph, for evaluation test 2-1, the average value of the film thicknesses is shown by black square plots, and the standard deviation of the film thicknesses is shown by black circle plots. For evaluation test 2-2, the average value of film thicknesses is shown by white square plots, and the standard deviation of the film thicknesses is shown by white circle plots.

No big difference in the standard deviation of the film thicknesses of the wafer W in the same slot exists between evaluation test 2-1 and evaluation test 2-2. As for the wafer W in the slot 134, it was confirmed that in evaluation test 2-1, the film thickness in the central portion of the wafer W is larger than the film thickness in the peripheral portion of the wafer W, but in evaluation test 2-2, the film thickness in the peripheral portion is larger than the film thickness in the central portion. However, as shown in the graph, as for the wafer W in the slot 134, the average value of the film thicknesses in evaluation test 2-2 is relatively largely lowered as compared with the average value of the film thicknesses in evaluation test 2-1.

In evaluation test 2-2, the dummy wafers D are not provided under the wafer W group. Therefore, a relatively large space is formed below the wafer W group. The $SiH_4$ gas heated to a relatively high temperature in the space is supplied to the lower side wafers W of the wafer W group, thereby generating a relatively large amount of Si in the peripheral portions of the lower side wafers W. As a result, it is considered that the film thickness distribution of the Si film has the film thickness distribution as described above. However, in evaluation test 2-2, the lower side wafers W of the wafer W group are not thermally insulated by the dummy wafers D. Therefore, the average value of the film thicknesses is relatively low as described above. In other words, if the mounting and the non-mounting of the dummy wafers D on the wafer boat 3 are switched without providing the ring plates R, as described in the background section of the present disclosure, it is difficult to achieve both a film thickness in the plane of the wafer having a desirable shape and improved uniformity in the film thickness between the wafers. In order to solve such a problem, embodiments of the present disclosure have been made.

(Evaluation Test 3)

In evaluation test 3, a film formation process was performed on the wafers W using the vertical heat treatment apparatus 6 of the second embodiment. A film forming gas was supplied at 1,500 sccm to the upper portion, central portion and lower portion of the reaction container 11, and the pressure inside the reaction container 11 during the film forming process was set to 0.45 Torr (60 Pa). After the film forming process, the film thickness of each wafer W and the uniformity of the film thickness in the plane of each wafer W were measured. Regarding the uniformity of the film thickness, a value was calculated by dividing ±(the maximum value of the film thickness−the minimum value of the film thickness)/(the average value of the film thickness)×100/2 (unit: ±%) by the haze of the film (haze unit: ppm). The unit of the calculated value is %. The smaller the calculated value is, the more uniform the film thickness is in the plane of the wafer W. In comparative test 3, a film forming process was performed under the same conditions as in evaluation test 3 except that the film forming process is performed using the vertical heat treatment apparatus 6 in which the cover 60 is not provided with the cover exhaust port 61. With respect to the film formed on the wafer W, measurement was conducted in the same manner as in evaluation test 3.

Figure 17:
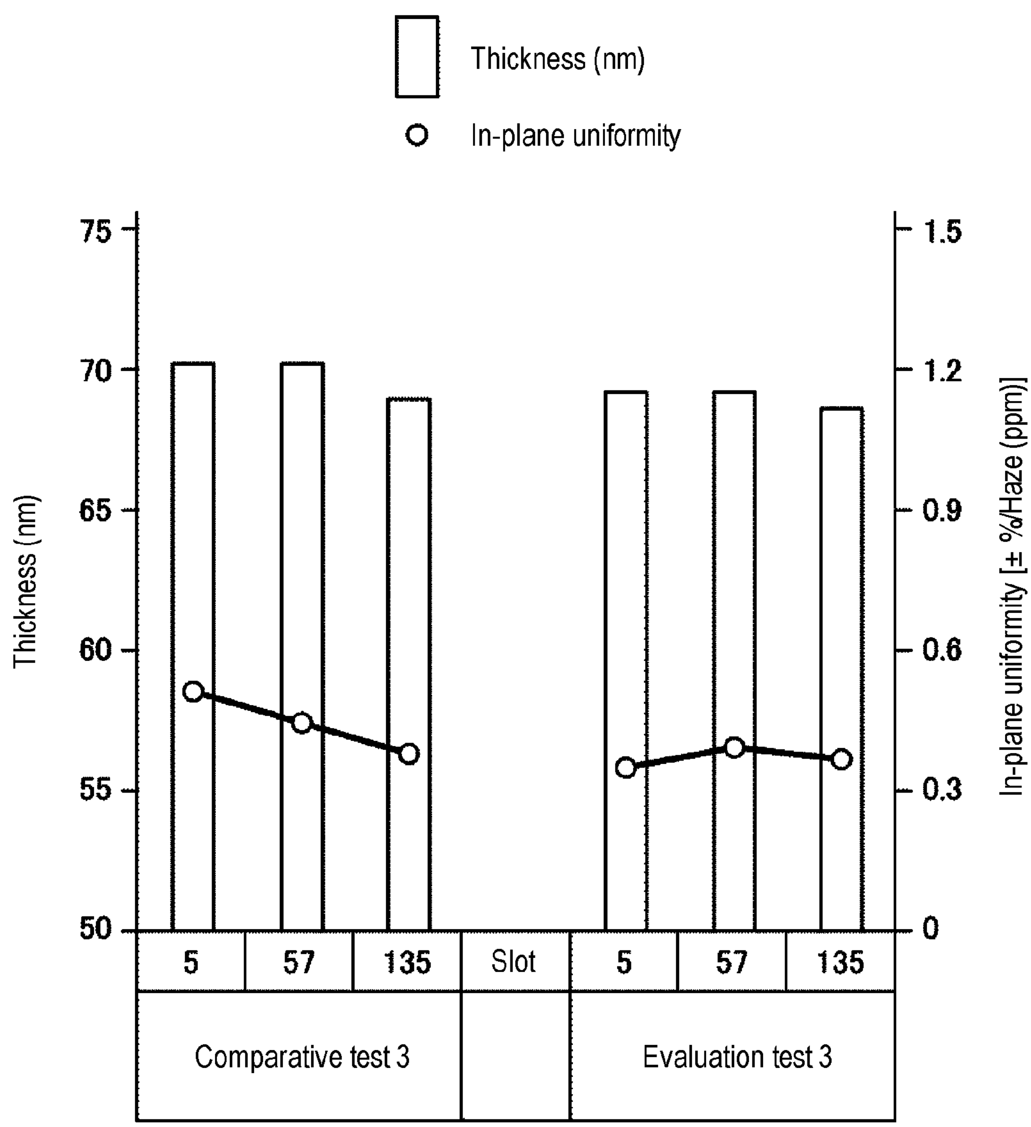
FIG. 17 is a graph showing the results of evaluation tests.

FIG. 17 is a graph showing the results for the respective wafers W in the slots 5, 57 and 135. The film thickness of the wafer W is indicated by a bar graph, and the uniformity of the film thickness in the plane of the wafer W is indicated by plots in the graph. From the bar graph, it is understood that the film thickness uniformity between the wafers W is higher in evaluation test 3 than in comparative test 3. Regarding the value of the uniformity of the film thickness in the plane of the wafer W, in comparative test 3, the wafer W in the slot 57 is higher than the wafer W in the slot 135, and the wafer W in the slot 5 is even higher. However, in evaluation test 3, there is no large difference in the value of the uniformity of the film thickness between the wafers W in the respective slots. The value of the uniformity is approximately the same as that of the wafer W in the slot 135 of comparative test 3. Specifically, in comparative test 3, the film thickness uniformity of the wafer W in the slot 5 is 0.53%. In evaluation test 3, the film thickness uniformity of the wafer W in the slot 5 is 0.33%. As described above, it was confirmed from the results of evaluation test 3 that by providing the cover exhaust port 61 in the cover 60, it is possible to increase the uniformity of the film thickness between the wafers W and to increase the uniformity of the film thickness in the plane of each of the wafers W mounted in the lower side slots of the wafer boat 3.

According to the present disclosure, in a substrate holder, a heat insulating member for thermally insulating an arrangement region of a plurality of substrates from an upper region UR above the arrangement region AR or a lower region LR below the arrangement region in a reaction container is provided above or below the arrangement region so that the insulating member overlaps with the arrangement region. The heat insulating member is provided with a through-hole at a position overlapping with the central portions of the substrates. Therefore, the amount of heat dissipated in the central portion of the substrate held near the heat insulating member can be made relatively large to adjust the temperature distribution in the plane of the substrate. This makes it possible to adjust the film thickness distribution in the plane of the substrate. In addition, the reduction in temperature of the substrate held near the heat insulating member is suppressed by the heat insulating member. As a result, it is possible to limit a decrease in the uniformity of the film thickness between the substrates.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for performing a film forming process on a plurality of substrates by heating the plurality of substrates with a heating part in a state in which the plurality of substrates are held in a shelf shape by a substrate holder in a vertical reaction container, comprising:

an exhaust part configured to evacuate an interior of the reaction container so as to form a vacuum atmosphere using a vacuum pump;

a gas supply part configured to supply a film forming gas into the reaction container kept in the vacuum atmosphere, the gas supply part including a valve for controlling a flow rate of the film forming gas; and a first heat insulating member provided above or below an arrangement region of the plurality of substrates in the substrate holder so as to overlap with the arrangement region and configured to thermally insulate the arrangement region from an upper region above the arrangement region or to thermally insulate the arrangement region from a lower region below the arrangement region in the reaction container, wherein the first heat insulating member has in its body a through-hole formed through the first heat insulating member at a position overlapping with central portions of the plurality of substrates so as to adjust a temperature distribution in a plane of each substrate of the plurality of substrates held in a vicinity of the first heat insulating member, wherein the first heat insulating member has an annular shape having an inner diameter identical to a diameter of the through-hole and an outer diameter identical to a diameter of each substrate of the plurality of substrates, and wherein the substrate holder has a plurality of slots in which some of the slots have the plurality of substrates mounted, and the first heat insulating member is detachably provided in another slot of the plurality of slots.

2. The film forming apparatus of claim 1, wherein a second heat insulating member, which has an outer diameter size identical to that of the substrates, not provided with the through-hole and configured to thermally insulate the arrangement region from the upper region or to thermally insulate the arrangement region from the lower region is provided between the arrangement region of the plurality of substrates and the first heat insulating member in the substrate holder.

3. The film forming apparatus of claim 1, wherein the first heat insulating member is provided below the arrangement region of the plurality of substrates, and the gas supply part is configured to supply the film forming gas to a position below the arrangement region in the reaction container.

4. A film forming method using a film forming apparatus for performing a film forming process on a plurality of substrates by heating the plurality of substrates with a heating part in a state in which the plurality of substrates are held in a shelf shape by a substrate holder in a vertical reaction container, comprising:

an exhaust part configured to evacuate an interior of the reaction container so as to form a vacuum atmosphere using a vacuum pump;

a gas supply part configured to supply a film forming gas into the reaction container kept in the vacuum atmosphere, the gas supply part including a valve for controlling a flow rate of the film forming gas; and a first heat insulating member provided above or below an arrangement region of the plurality of substrates in the substrate holder so as to overlap with the arrangement region and configured to thermally insulate the arrangement region from an upper region above the arrangement region or to thermally insulate the arrangement region from a lower region below the arrangement region in the reaction container, wherein the first heat insulating member has in its body a through-hole formed through the first heat insulating member at a position overlapping with central portions of the plurality of substrates so as to adjust a temperature distribution in a plane of each substrate of the plurality of substrates held in a vicinity of the first heat insulating member, wherein the first heat insulating member has an annular shape having an inner diameter identical to a diameter of the through-hole and an outer diameter identical to a diameter of each substrate of the plurality of substrates, and wherein the substrate holder has a plurality of slots in which some of the slots have the plurality of substrates mounted, and the first heat insulating member is detachably provided in another slot of the plurality of slots, the method comprising:

by the exhaust part, evacuating the interior of the reaction container so as to form the vacuum atmosphere; and by the gas supply part, supplying the film forming gas into the reaction container kept in the vacuum atmosphere.

* * * * *